United States Patent [19]
Valley

[11] Patent Number: 5,139,578
[45] Date of Patent: Aug. 18, 1992

[54] LIQUID CRYSTAL COVERSLIDES FOR SOLAR CELLS

[76] Inventor: Charles R. Valley, 1309 Redbud Dr., Fairborn, Ohio 45324

[21] Appl. No.: 644,348

[22] Filed: Jan. 22, 1991

[51] Int. Cl.5 .................. H01L 31/04; H01L 31/0232; H01L 31/08
[52] U.S. Cl. ..................................... 136/257; 136/292
[58] Field of Search ........................ 136/256, 257, 292

[56] References Cited

U.S. PATENT DOCUMENTS

| | | | |
|---|---|---|---|
| 4,669,828 | 6/1987 | Parker | 350/339 |
| 4,693,560 | 9/1987 | Wiley | 350/335 |
| 4,749,261 | 6/1988 | McLaughlin et al. | 350/339 |
| 4,772,102 | 1/1988 | Fergason et al. | 350/338 |
| 4,791,418 | 12/1988 | Kawahara et al. | 340/784 |

FOREIGN PATENT DOCUMENTS

| | | | |
|---|---|---|---|
| 3146701 | 7/1983 | Fed. Rep. of Germany | 136/257 |
| 53-144287 | 12/1978 | Japan | 136/257 |
| 61-154182 | 7/1986 | Japan | 136/257 |
| 63-226973 | 9/1988 | Japan | 136/257 |
| 1-8678 | 1/1989 | Japan | 136/257 |
| 1-120076 | 5/1989 | Japan | 136/257 |
| 1-187880 | 7/1989 | Japan | 136/257 |
| 1-245564 | 9/1989 | Japan | 136/257 |
| 2-47627 | 2/1990 | Japan | 136/257 |

Primary Examiner—Aaron Weisstuch
Attorney, Agent, or Firm—Fredric L. Sinder; Donald J. Singer

[57] ABSTRACT

A liquid crystal coverslide for both protecting and concealing solar cells and solar cell arrays is disclosed. A conventional construction of an emulsion of encapsulated liquid crystal droplets is sandwiched between two pieces of polyester or silica to form a coverslide which is in turn mounted over a solar cell or solar cell arrays. The liquid crystal coverslide is electrically switched between transparent and opaque operating modes in order to achieve full light transmission-full power output or protection-concealment.

2 Claims, 1 Drawing Sheet

LIQUID CRYSTAL COVERSLIDES FOR SOLAR CELLS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to solar cells, and more particularly to a protective liquid crystal coverslide for solar cells and solar cell arrays.

Solar cells can be damaged by too much radiation, particularly laser irradiation from a hostile source. The prior art has placed coverslides over solar cells to provide protection by filtering out damaging radiation. The prior art has also placed etched coverslides over solar cells to conceal, to an extent, the solar cells from hostile sources. This latter mode of protection has been proposed in connection with space-based solar cell arrays, particularly solar cell arrays intended for use as power sources for Space Defense Initiative satellites.

Unfortunately, prior art coverslides, particularly etched coverslides, block a significant portion of incoming usable sunlight, thus reducing the power available from the solar cells.

Thus it is seen that there is a need for solar cell coverslides that provide both protection and concealment for solar cells without significantly limiting their available power.

It is, therefore, a principal object of the present invention to provide solar cell coverslides that provide both protection and concealment for solar cells while permitting maximum transmission of incoming sunlight.

It is a feature and advantage of the present invention that it can be remotely controlled to switch on and off the transmission of sunlight to solar cells.

These and other objects, features and advantages of the present invention will become apparent as the description of certain representative embodiments proceeds.

SUMMARY OF THE INVENTION

The present invention provides a coverslide for solar cells that can both protect and conceal solar cells and solar cell arrays. The unique discovery of the present invention is that making solar cell coverslides with liquid crystals, transmission through which can be electrically switched on and off, provides both protection and concealment for the underlying solar cells.

Accordingly, the present invention is directed to a solar cell apparatus, comprising a solar cell and a coverslide made of two thin film layers and, sandwiched between the film layers, a layer of encapsulated liquid crystal droplets suspended in a polymer matrix. The thin film layers may be made of polyester or silica.

The invention is also directed to a method for switching the output from a solar cell between full and partially on, and for switching the solar cell between a visible and a concealed mode, comprising the steps of covering the solar cell with a coverslide comprising two thin film layers and, sandwiched between the film layers, a layer of encapsulated liquid crystal droplets suspended in a polymer matrix; and, applying a voltage across the liquid crystal droplets layer to switch from partial output and concealed mode to full output and visible mode.

DESCRIPTION OF THE DRAWING

The present invention will be more clearly understood from a reading of the following detailed description in conjunction with the accompanying drawing wherein.

DETAILED DESCRIPTION

Figure 1:
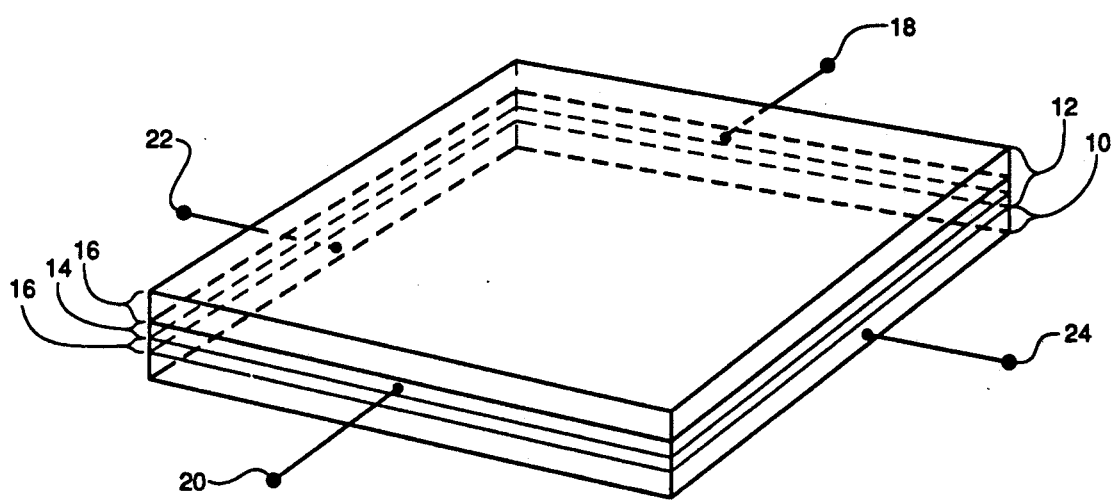
FIG. 1 is a perspective representative view of a solar cell and a liquid crystal coverslide according to the teachings of the present invention.

Referring now to FIG. 1 of the drawings, there is shown a perspective representative view of a solar cell 10 and coverslide 12 according to the teachings of the present invention. Solar cell 10 may be either a conventional solar cell or any more efficient solar cell such as may now exist or may be developed in the future. Its electrical output is through leads 22 and 24. Liquid crystal coverslide 12 is a conventional construction of a Nematic Curvilinear Aligned Phase emulsion film of liquid crystal droplets encapsulated in a polymer matrix 14 that is in turn sandwiched between two pieces 16 of polyester or thin layer silica. The layers are representative and their relative thicknesses are not intended to be true to scale. Voltage can be applied to liquid crystal coverslide 12 through leads 18 and 20. Typically, a low voltage applied across liquid crystal coverslide 12 will align the liquid crystals with the induced electric field so that the coverslide is transparent, enabling full light reception to solar cell 10.

During threat periods, the voltage is reduced to zero so that the orientation of the liquid crystals becomes more random and coverslide 12 becomes opaque. Potentially damaging incoming light is diffused or scattered to protect underlying solar cell 10 and reflected sunlight is diminished, thus also reducing possible detection of the solar cell. When a threat or possible threat ends, coverslide 12 is remotely switched to restore a low voltage to leads 18 and 20 and again allow nearly full transmission of sunlight to the solar cell or solar cell array.

Emulsion layer 14 may be doped so that coverslide may appear to be completely black or even metallic during a threat period.

The disclosed liquid crystal coverslide successfully demonstrates using an electrically switchable coverslide for both protection and concealment of solar cells and solar cell arrays. Although the disclosed apparatus is specialized, its teachings will find application in other areas where currently passive protection or concealment means are used.

It is understood that various modifications to the invention as described may be made, as might occur to one with skill in the field of the invention, with the scope of the claims. Therefore, all embodiments contemplated have not been shown in complete detail. Other embodiments may be developed without departing from the spirit of the invention or from the scope of the claims.

I claim:

1. A method for protecting a solar cell from harmful irradiation, comprising the steps of:
    (a) providing a coverslide covering the solar cell, the coverslide comprising:
        (i) two thin film layers; and, (ii) sandwiched between the film layers, a layer of encapsulated liquid crystal droplets suspended in a polymer matrix;

(b) supplying a voltage across the layer of encapsulated liquid crystal droplets to align the liquid crystals so that the coverslide is transparent;

(c) detecting for the presence of harmful irradiation; and, (d) when harmful irradiation is detected, reducing the supplied voltage so that the orientation of the liquid crystals becomes random and the coverslide becomes opaque.

2. A method for protecting a solar cell from detection, comprising the steps of:

(a) providing a coverslide covering the solar cell, the coverslide comprising:
  (i) two thin film layers; and,
  (ii) sandwiched between the film layers, a layer of encapsulated liquid crystal droplets suspended in a polymer matrix;

(b) supplying a voltage across the layer of encapsulated liquid crystal droplets to align the liquid crystals so that the coverslide is transparent; and, (c) when concealment of the solar cell is desired, reducing the supplied voltage so that the orientation of the liquid crystals becomes random and the coverslide becomes opaque.

* * * * *